United States Patent [19]

Glashauser

[11] Patent Number: 4,528,071
[45] Date of Patent: Jul. 9, 1985

[54] PROCESS FOR THE PRODUCTION OF MASKS HAVING A METAL CARRIER FOIL

[75] Inventor: Walter Glashauser, Munich, Fed. Rep. of Germany

[73] Assignee: Siemens Aktiengesellschaft, Berlin and Munich, Fed. Rep. of Germany

[21] Appl. No.: 660,295

[22] Filed: Oct. 12, 1984

[30] Foreign Application Priority Data

Oct. 25, 1983 [DE] Fed. Rep. of Germany ....... 3338717

[51] Int. Cl.³ .......................... C25D 1/08; C25D 5/02; C25D 5/12
[52] U.S. Cl. ....................................... 204/11; 204/15; 204/38.4
[58] Field of Search .................... 204/11, 15, 38.4, 12, 204/24, 32.1

[56] References Cited

U.S. PATENT DOCUMENTS

| 3,192,136 | 6/1965 | Reid | 204/11 |
| 3,342,706 | 9/1967 | Liben | 204/11 |
| 3,402,110 | 9/1968 | Scherrer | 204/11 |
| 3,449,221 | 6/1969 | Thomas | 204/15 |
| 3,476,658 | 11/1969 | Corwin | 204/11 |
| 3,988,153 | 10/1976 | Politycki | 204/38.4 |
| 4,058,432 | 11/1977 | Schuster-Woldan | 204/11 |

Primary Examiner—Thomas Tufariello
Attorney, Agent, or Firm—Hill, Van Santen, Steadman & Simpson

[57] ABSTRACT

A method for constructing an x-ray mask having a metal carrier foil supporting an x-ray absorbing structure on a metal frame characterized by providing a carrier plate coated with a nickel layer on which a carrier foil is deposited, then forming an electrodepositing mask on the carrier foil with portions of the carrier foil being exposed, electroplating gold onto the exposed portions and subsequently etching the carrier plate to form a window therein and then etching the exposed nickel layer to at least expose the surface of portions of the carrier foil.

10 Claims, 8 Drawing Figures

PROCESS FOR THE PRODUCTION OF MASKS HAVING A METAL CARRIER FOIL

BACKGROUND OF THE INVENTION

The present invention is directed to a method for the production of masks for x-ray lithography which are used to produce a pattern in the x-ray resist material during a reproductin process. Each of the masks consist of a frame having an opening or window, a carrier foil composed of metal which extends across the window, is clamped to the frame and is permeable to x-rays, and a mask structure which is arranged on the carrier foil and is impermeable to x-rays.

X-ray lithography is a reproduction process which uses x-rays to reproduce a structure of an x-ray mask on a substrate by shadow projections. One of the main difficulties in the industrial application of x-ray lithography consists in the production of suitable x-ray masks.

The x-ray mask consists of a frame with a metal foil clamped thereto and of an absorber structure arranged on the metal foil.

In German Pat. No. 26 26 851, a process for the production of masks for x-ray lithography is described. In this process, the structure carrier consists of a metal or synthetic foil which together with the mask structure is formed on a base, for example, glass. The base is then etched away by selective etching using an etching covering in such a manner that only its edge zones remain and forms the outer mask frame having an opening or window.

SUMMARY OF THE INVENTION

The present invention is directed to developing a method for producing an x-ray mask by which masks can be produced more simply than heretofore with a carrier foil consisting of metal. In addition, the carrier foil is to possess transparent surfaces which are partially covered by an absorber structure to create an alignment mark in order to permit adjustment between the mask and the structures which have already been produced in the resist.

In order to mechanically strengthen the thin carrier foil on the rear surface of the absorber structure an additional metal layer is provided so that the carrier foil lies between the absorber structure on the one hand and the strengthening structure of the additional layer. The strengthening structure must be somewhat set back in relation to the absorber structure so that it does not lie in the path of the x-rays during irradiation.

The present invention is directed to a method for producing masks for x-ray lithography to produce a pattern in an x-ray resist during the reproduction process, said mask consisting of a frame having an opening, a carrier foil being clamped to the frame to extend across the opening and being of a metal which is permeable to x-rays and a mask structure of a desired pattern being arranged on the carrier foil and being impermeable to x-ray. The method comprises the steps of providing a metal carrier plate, ap.olying a first metal layer on a surface of said carrier plate, then depositing a second metal layer on the first metal layer to a rhickness in a range of 1-3 $\mu$m to form a carrier foil, applying a polymethylmethacrylate layer of a thickness in a range of 10-15 $\mu$m on the second metal layer, structuring the polymethylmethacrylate to create a plating mask which provides exposed surface portions of the second layer, electroplating a third metal layer of nickel to a thickness in a range of 1-2 $\mu$m on the exposed surface portion metal layer, then electroplating a gold layer to a thickness in a range of 8-10 $\mu$m on the third layer of metal, subsequently etching the carrier plate without etching the first metal layer to form the frame with an opening exposing a portion of the first layer and then selectively etching the exposed portion of the first layer to expose at least one portion of the carrier foil. The advantage of the invention is that this process makes it is possible to produce a high absorber structure having very small dimensions. These absorber structures can be mechancially supported from the rear by means of an additional metal layer so as to produce an extremely stable arrangement although the carrier foil formed by the second metal layer can be very thin.

The step of depositing the second metal layer which forms the carrier foil on the first metal layer is preferably done by a vapor-depositing step or by sputtering. The carrier plate is preferably a copper plate and the first metal layer preferably is a nickel layer while the carrier foil consists of either a titanium layer, an aluminum layer or a plurality of metal layers of different metals which are alternately arranged such as titanium and aluminum layers. While the entire first layer exposed by forming the opening in the base pr carrier plate can be removed, it is desirable to provide an etching resist pattern on the exposed first layer and selectively etch the first layer to produce a structure substantially the same as the pattern on the gold absorber structure to provide additional support for the absorber structure.

The production of deep-resist structures as required for the production of precision flat components with the assistance of x-ray lithography require an x-ray mask having a high mask contrast. The contrast of a mask is determined by the selection of the carrier foil material, the absorber material and the thickness thereof for a given wavelength distribution for the x-ray. A mask contrast, which is adequate for the production of precision flat components, is achieved by a metal combination of gold for the absorber layer and titanium as a carrier layer where the gold structure must have a minimum thickness of 8 $\mu$m and the titanium foil must have a maximum thickness of no greater than 3 $\mu$m.

In a further embodiment of the invention, it is desirable to provide adjusting or alignment marks on the mask. This is accomplished by prior to providing the layer of polymethylmethacrylate on the second metal layer, etching a small window in the second metal layer, then structuring the polymethylmethacrylate foil in the area of the window so that a gold structure will be disposed in this window having the desirable configuration. It is desirable when etching the first metal layer to leave a portion underlying the window to stiffen or strengthen the alignment mark.

BRIEF DESCRIPTION OF THE DRAWINGS

FIG. 2 showing forming a pattern in a mask layer; FIG. 3 showing a deposited third layer and gold layer in the exposed portions of the mask after the mask has been removed; FIG. 4 showing etching to form the window or opening in the base or carrier member; and FIG. 5 showing etching of the exposed first layer;

DESCRIPTION OF THE PREFERRED EMBODIMENTS

Figure 5:
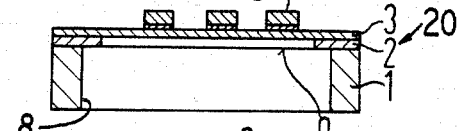

The principles of the present invention are particularly useful in forming an x-ray mask generally indicated at 20 in FIG. 5 for use in x-ray lithography. The mask 20 has a frame 1, which has an opening or window 8 with a carrier foil or layer 3 extending thereacross. Disposed on the carrier foil is a mask or absorber structure 6 of a desired pattern.

The method for forming the x-ray mask 20 is illustrated in FIGS. 1–5 and comprises the steps of providing a carrier plate or base 1a which preferably consists of copper and electroplating a first metal layer 2, which is preferably of nickel onto one surface of the base or carrier 1a. The layer 2 preferably has a thickness of several micrometers and, for example, has a thickness of approximately 5 $\mu$m. After electroplating the layer 2, a second layer 3, which has a thickness in a range of 1–3 $\mu$m is deposited on the surface of the first layer 2 either by a vapor-deposition or by sputtering. The layer 3 may be a titanium layer or an aluminum layer or a multiple series of layers having plies or layers of titanium and aluminum. The metal forming the layer 3 must have a low absorption of the x-ray radiation and thus is a permeable metal layer.

The type of structure transfer in a mask production whether it is ultraviolet or x-ray lithography is determined by the resolution limit of the process in question. Fundamentally, both processes can be used. In order to produce an x-ray mask of the desired absorber dimensions, it is necessary to use x-ray lithography as the structuring process. After forming the second metal layer 3, a 1 $\mu$m thick polymethylmethacrylate lacquer layer is applied by a centrifuge process on an exposed surface of the layer 3. Then, a polymethylmethacrylate foil, which is produced by calendering and which has a thickness of approximately 10–15 $\mu$m, is caused to adhere to the titanium layer, for example, by means of a cyanacrylate adhesive. The polymethylmethacrylate (PMMA) foil or layer is structured in a known manner by means of an x-ray mask 5 to produce a plating mask 4 with a desired pattern. It is noted that this pattern is a negative image of the absorber structure which is to be formed.

Following the structuring of the mask 4, an absorber structure is then electroplated on the exposed surfaces of the layer 3. Here it has proved expedient to first electroplate a thin third layer 7 of nickel having a thickness of approximately 1 $\mu$m prior to electroplating the gold because the bonding strength between the plating mask 4 and the titanium layer 3 is generally inadequate for the gold electroplating process. The slight underplating of nickel can be removed later by selective etching if necessary. After plating the gold absorber structure 6, the plating mask 4 is removed by a suitable solvent to produce the structure illustrated in FIG. 3.

Using an etching agent, which will selectively dissolve the material of the base 1a without etching the layer 2, for example, an etching agent which dissolves copper but does not dissolve nickel, a window or opening 8 of the desired size is etched into the rear of the carrier 1a to form the frame 1. This process can be carried out by a spray-etching machine of a conventional type with a conventional mask to protect the portions of the plate 1a that are to be retained as the frame 1. The nickel layer 2, which was of a thickness of approximately 5 $\mu$m, acts as a mechanical carrier for the overlying, sensitive titanium layer 3, and as a barrier layer during this etching step.

Figure 6:
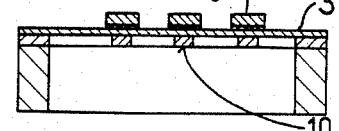
FIG. 6 is a cross-sectional view of a device similar to FIG. 5 with a specific pattern etched into the first layer.

After etching the base 1a to form the frame 1 with the window or opening 8, a selective acting etching liquid, for example, copper chloride is used to etch the nickel layer 2 to form a window 9 in the layer 2 as illustrated in FIG. 5. This is accomplished in a dipping process or following the application of a photolacquer which is exposed and developed to expose portions of the layer 2 which subsequently are etched to form a structure such as 10 in FIG. 6. It should be noted that the particular etching material will not attack the titanium foil 3. The tension in the titanium foil leads to the fact that the foil remains in the clamped state on the remaining frame 1. It should be noted that the structure 10 formed in the first layer 2 has a pattern that is the same shape as the pattern of the gold absorber structure 6 but of a slightly smaller dimension so as not to create any undesirable shadow during the use of the mask. The pattern structure 10 also greatly increases the strength of the carrier layer 3.

Figure 1:
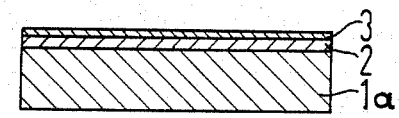
FIGS. 1–5 are cross-sectional views illustrating various steps in the method according to the present invention with FIG. 1 showing the carrier member or base with the first two layers.
Figure 2:
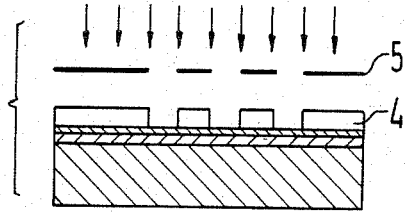
Figure 3:
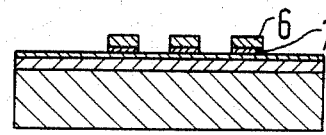
Figure 4:
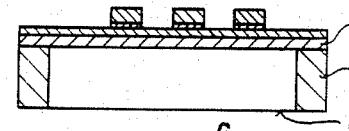
Figure 7:
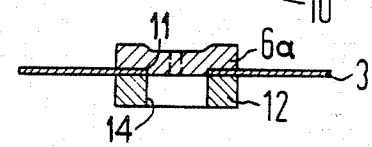
FIG. 7 is a cross-sectional view of an alignment mark taken along lines VII—VII of FIG. 8.

In a further embodiment, adjusting marks or aligning marks can be provided in the mask to facilitate the adjustment and alignment of the mask on a structure which is being exposed during a subsequent x-ray lithography process. To accomplish this, after applying the layer 3 of titanium as illustrated in FIG. 1 and prior to applying the polymethylmethacrylate layer, a window 11 (FIGS. 7 and 8) can be etched into the titanium layer 3. During the exposure of the polymethylmethacrylate layer to form the structure 4, an appropriate exposed pattern such as a cross is formed over the window 11. Then, while applying the gold, a gold cross structure 6a will be applied to overlie portions of the window 11 which is bridged in a cantilever fashion by the cross or mark 6a.

Figure 8:
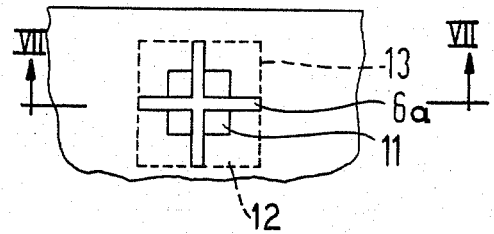
FIG. 8 is a plan view of the alignment mark of FIG. 7.

In addition, the area of the adjustment mask can be strengthened or stiffened from the rear by a nickel structure 12 which an outline such as shown in broken lines 13 in FIG. 8 and an opening 14 which is matched to the window 11. The nickel structure 12 is formed while etching the nickel layer 2 after applying an appropriate etching mask.

Although various minor modifications may be suggested by those versed in the art, it should be understood that I wish to embody within the scope of the patent granted hereon, all such modifications as reasonably and properly come within the scope of my contribution to the art.

I claim:

1. A method for producing masks for x-ray lithography to produce a pattern in an x-ray resist during a reproduction process, said masks consisting of a frame having an opening, a carrier foil being clamped to the frame to extend across the opening and being of a metal which is permeable to x-ray and a mask structure of a desired pattern being arranged on the carrier foil and being impermeable to x-ray radiation, said method comprising the steps of providing a metal carrier plate, applying a first metal layer on a surface of said carrier plate, then depositing a second metal on the first metal layer to a thickness in a range of 1–3 $\mu$m to form a carrier foil, applying a polymethylmethacrylate layer of a thickness in the range of 10-15 μm on the second metal layer, structuring the polymethylmethacrylate layer to create a plating mask which provides exposed surface portions of the second layer, electroplating a third metal layer of nickel to a thickness in the range of 1-2 μm on the exposed portions of the second metal layer; then electroplating a gold layer to a thickness in the range of 8-10 μm on the third layer of metal, subsequently etching the carrier plate without etching the first metal layer to form the frame with the opening exposing a portion of the first layer and then selectively etching the exposed portion of the first metal layer to expose at least one portion of the carrier foil.

2. A method according to claim 1, wherein the step of depositing the second metal layer comprises vapor-depositing the layer on the first metal layer.

3. A method according to claim 1, wherein the step of depositing the second metal layer comprises sputtering the second layer onto the first metal layer.

4. A method according to claim 1, wherein the step of providing a metal carrier plate provides a copper plate, the step of applying a first metal layer applies a first metal layer of nickel and wherein the step of depositing the second metal layer deposits a second metal layer of titanium.

5. A method according to claim 4, wherein the step of etching the carrier member to form the frame utilizes an etching agent which dissolves copper but does not attack nickel and said step of selectively etching the first layer utilizes a dipping process with copper chloride as the etching agent which will not attack the second metal layer of titanium but etches the nickel of the first layer.

6. A method according to claim 5, wherein the step of etching the first nickel layer includes applying a etching mask having a pattern corresponding to the pattern of the structure of gold deposited on the opposite surface and etching the first nickel layer to produce a reinforcing structure for the carrier foil.

7. A method according to claim 1 which includes providing an aligning mark in the mask by etching a window in the carrier foil prior to the step of applying the polymethylmethacrylate layer, said step of forming the etching mask exposing an aligning mark over the window in the second layer so that a gold deposit extends across said window, and said step of etching the first layer removes the first layer adjacent to said window in the second layer.

8. A method according to claim 7, wherein said step of etching the first layer after etching the carrier member includes applying a mask pattern adjacent the window in the second layer so that a stiffening frame is retained from the etched first layer to surround the window in the second layer.

9. A method according to claim 1, wherein the step of depositing the second layer deposits an aluminum layer.

10. A method according to claim 1, wherein the process of depositing the second layer deposits a second layer of a plurality of layers by alternately depositing titanium and aluminum layers.

* * * * *